United States Patent [19]
Nemoto

[11] Patent Number: 5,481,438
[45] Date of Patent: Jan. 2, 1996

[54] TRAY FOR SEMICONDUCTOR DEVICES

[75] Inventor: Hisashi Nemoto, Tokyo, Japan

[73] Assignee: Shinon Denkisangyo Kabushiki Kaisha, Tokyo, Japan

[21] Appl. No.: 301,239

[22] Filed: Sep. 6, 1994

[51] Int. Cl.[6] .................................................. H05K 7/02
[52] U.S. Cl. .................. 361/810; 361/807; 361/809; 361/820; 174/255; 206/725; 220/476
[58] Field of Search ................................. 361/212, 220, 361/807, 809, 810, 818, 820; 174/52.4, 255, 266; 206/333, 328, 329, 332, 334; 220/476, 500, 505, 200

[56] References Cited

U.S. PATENT DOCUMENTS

| | | | |
|---|---|---|---|
| 5,080,228 | 1/1992 | Maston, III et al. | 206/331 |
| 5,263,583 | 11/1993 | Ohashi | 206/334 |
| 5,314,068 | 5/1994 | Nakazato et al. | 206/454 |

*Primary Examiner*—Leo P. Picard
*Assistant Examiner*—Y. Whang
*Attorney, Agent, or Firm*—Frishauf, Holtz, Goodman, Langer & Chick

[57] ABSTRACT

Trays having the same size are piled up by fitting a downward extending edge frame formed on the whole periphery of the undersurface of each tray on the outer wall of the upward extending outer peripheral frame formed on the outer wall of the lower tray. The tray has multiple rectangular pockets defined by longitudinal and crosswise partition portions formed in a space defined by the inner wall of the outer peripheral frame. An upward projecting base is formed in the central portion of each pocket, for supporting the undersurface of a semiconductor device. Downward extending ribs are formed on the undersurface of each tray. Each rib surrounds upper side portions of the semiconductor device housed in the corresponding pocket of the lower tray and fitted on the inner wall of the inner wall of the lower tray. A first horizontal space $D_1$ is defined between the outer peripheral frame and the edge frame, and a second horizontal space $D_2$ is defined between the outer wall of the downward extending rib and the inner wall of the pocket in such a manner that $D_1 > D_2$.

7 Claims, 3 Drawing Sheets

TRAY FOR SEMICONDUCTOR DEVICES

BACKGROUND OF THE INVENTION

1. Field of the Invention

The present invention relates to a tray for housing semiconductor devices such ICs, and more particularly to a tray suited for housing and transporting thin semiconductor devices having leads on every lateral side.

2. Description of the Prior Art

As semiconductors such as ICs have been integrated more and more, they have become miniaturized more and more and thinner and thinner. Thus, it has become necessary to apply as small external shocks as possible to the devices, and the structure of the trays greatly influences the yield of the semiconductor devices.

Many semiconductor devices have wiring leads consisting of extremely thin metal wires extending externally from the semiconductor devices, and such a problem arises that leads are likely to be deformed or bent when the leads contact the corresponding inner walls of the pockets or the like in a tray.

As shown in FIG. 6, the conventional tray for semiconductor devices has rectangular pockets 24 defined by longitudinal and crosswise partition portions formed in the space defined by an outer peripheral frame 22 and a base 25 projectingly formed in each pocket 24. After semiconductor devices 26 have been loaded on the corresponding bases 25, another tray is mounted on the first tray. Thus, the semiconductor devices are housed in the combination of the trays.

Downward extending ribs surrounding the side walls of the upper portion of the semiconductor devices housed in the pockets 24 in the lower tray are formed on the undersurface of the upper tray 21, and an edge frame 28 extends along the whole periphery of the tray and projects downward from the undersurface of the tray.

In order to pile up trays, the edge frame 28 of the upper tray is fitted on the outer wall of the outer peripheral frame 22. A small space is provided between the inner wall of the edge frame 28 and the outer wall of the outer peripheral frame 22. The space is provided so as to admit dimensional tolerance between the upper and lower trays and is defined by a horizontal space $d_1$.

In the conventional trays, the horizontal space $d_2$ between the outer wall of the downward extending rib 27 and the inner wall of the corresponding pocket 24 is larger than the horizontal space $d_1$ so that the downward extending ribs 27 do not contact the inner walls of the pockets even if the upper and lower trays are displaced horizontally from each other. The horizontal space $d_3$ between the inner wall of the downward extending rib 27 and the lateral surface of the device 26 is slightly larger than the space $d_1$ in such a manner that the downward extending rib 27 presses the corresponding device 26 even if displacement occurs between the upper and lower trays by a distance equal to the space $d_1$.

When, however, the trays receive a large shock due to dropping of the tray during transportation, the trays are flexed and thereby locally applied with pressure. The upper side portions of some devices 26 are strongly pressed by the inner walls of the downward ribs 27, resulting in deformation of the devices. The upward extending ribs 29 projecting from the peripheral edges of the upper surfaces of the bases and holding the side walls of the lower portions of the devices are pressed against the side walls of the lower portions of the devices and broken. Further, the fractures of the broken ribs 29 deform and/or damage to the leads 26a of the devices occurs.

SUMMARY OF THE INVENTION

The object of the present invention is to provide a tray for semiconductor devices in which shock is distributed so that excessive pressure is not exerted on the devices when the shock due to dropping of the tray or the like is applied to the tray so that distortion of the device and/or damage is eliminated.

In order to achieve the object, the present invention provides a tray for semiconductor devices on which another tray can be mounted and/or which can mount another tray, said another tray having the same structure as the tray comprising:

an upper face, an undersurface and an outer periphery;

an outer peripheral frame extending upward and having an outer wall and defining a space;

longitudinal partition portions and crosswise partition portions formed in the space, for defining a multiple rectangular pockets each having a central portion and an inner wall;

an edge frame extending downward from the undersurface at the outer periphery and formed so as to be fitted on the outer wall of the outer peripheral frame of said another tray which is disposed below the tray;

a base projectingly formed in the central portion of each of said pockets, for supporting an undersurface of a semiconductor device;

downward extending ribs formed on the undersurface of the tray, each of the downward extending ribs having an outer wall and an inner wall surrounding side walls of upper portions of the semiconductor device housed in the corresponding pocket of said another tray disposed below the tray and fitted on the inner wall of said another tray disposed below the tray; and the outer peripheral frame and the edge frame defining therebetween a first horizontal space $D_1$ and the outer wall of the downward extending rib and the inner wall of the pocket defining therebetween a second horizontal space $D_2$ in such a manner that $D_1 > D_2$.

DETAILED DESCRIPTION OF THE PREFERRED EMBODIMENTS

Embodiments of trays for semiconductor devices according to the present invention will be detailed with reference to FIGS. 1 to 5.

In use, the trays for housing semiconductor devices according to the present invention are piled up. The upper surface of each tray defines a container for receiving a corresponding semiconductor device, and the undersurface of the upper tray functions as a lid for covering the corresponding container of the lower tray.

Figure 1:
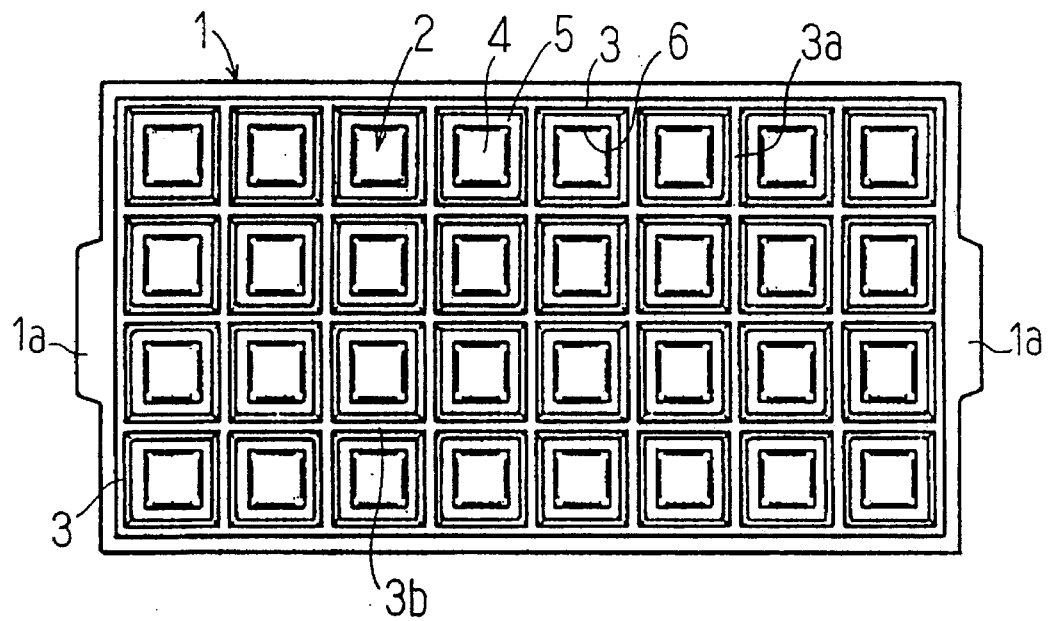
FIG. 1 is a plan view of an embodiment of a tray according to the present invention.
Figure 2:
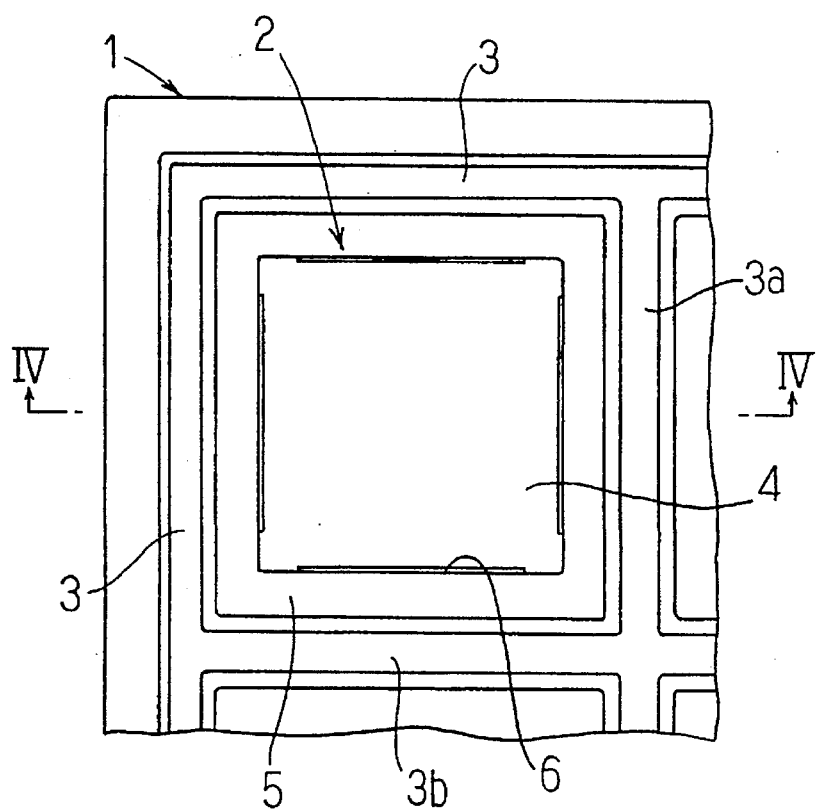
FIG. 2 is an enlarged plan view of the embodiment.

As shown in FIGS. 1 and 2 are formed multiple pockets 2 for housing semiconductor devices. Pockets 2 formed in an upward projecting outer peripheral frame 3 are divided by longitudinal and crosswise partitions 3a and 3b.

A base 4 on which a semiconductor device is mounted is formed in the central portion of each pocket 2. The upper surface of the base 4 is flat and higher than the bottom surface of the pocket 2. A circumferential groove 5 is formed between the base 4 as one party and the outer peripheral frame 3 and the partition portions 3a and 3b as the other parties.

The outer peripheral frame 3 and the partition portions 3a and 3b are higher than the upper surface of the semiconductor device mounted on the base 4. The height of the base 4 is selected so that leads extending from the side walls of the semiconductor device mounted on the base 4 do not contact the bottom surface of the circumferential groove 5.

On the four edge portions of the upper surface of the base 4 are formed upward extending ribs 6 in such a way that the ribs 6 surround the lower portions of the lateral sides of the semiconductor device. The portion of the upper surface of the base 4 which is surrounded by the base portion of the ribs 6 is similar to and is slightly larger than the bottom of the semiconductor device. More specifically, the thickness and the height of the rib 6 is selected so that the rib 6 is completely inserted in the space between a side wall of the semiconductor device and a lead extending downward at the lateral side wall of the semiconductor device.

Holding portions 1a are provided for carrying the tray 1.

Figure 3:
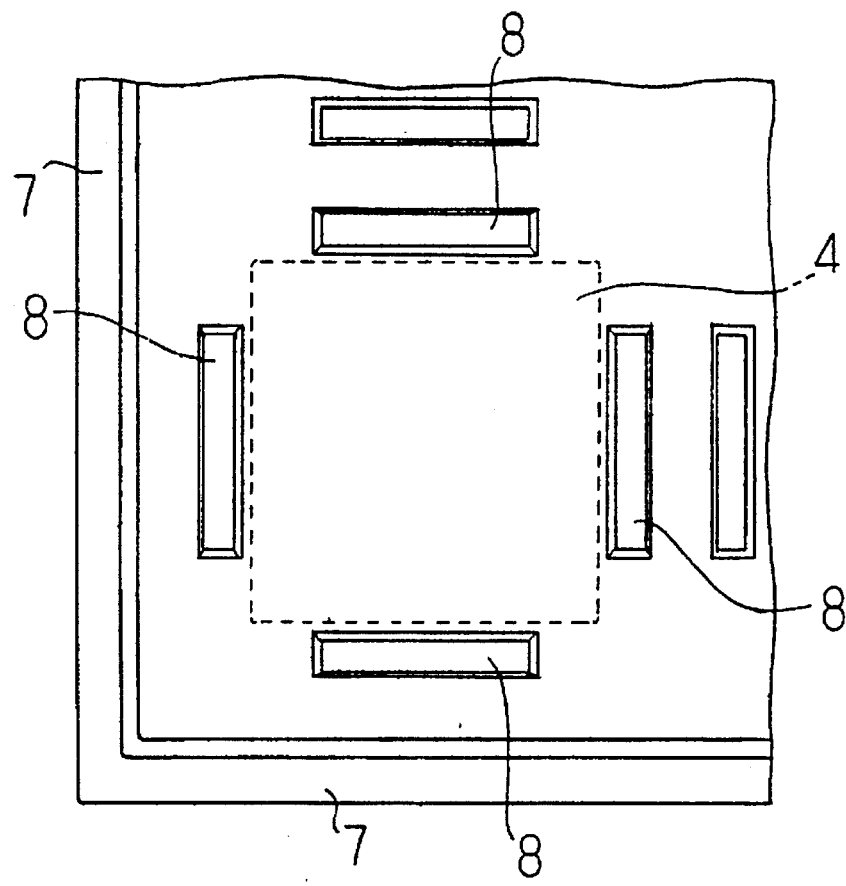
FIG. 3 is an enlarged bottom view of the tray of embodiment.
Figure 4:
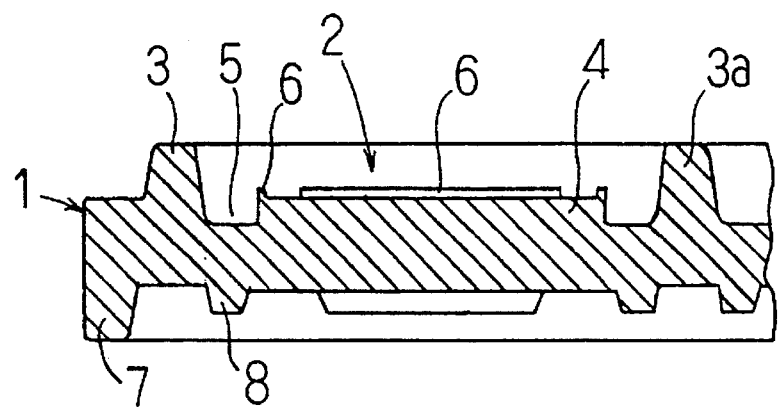
FIG. 4 is a cross-sectional view taken along line IV—IV in FIG. 2.

Downward extending from the undersurface of the tray 1 are formed an edge frame 7 on the entire outer peripheral portion of the tray 1 and ribs 8 disposed corresponding to the respective pockets 2, as shown in FIG. 3. The inclination of the inner wall of the downward extending ribs 8 is substantially equal to the inclination of the side wall of the upper portion of the semiconductor device, and the height of the downward extending ribs is selected to such a value that they do not contact the leads extending from the side wall of the semiconductor device.

Figure 5:
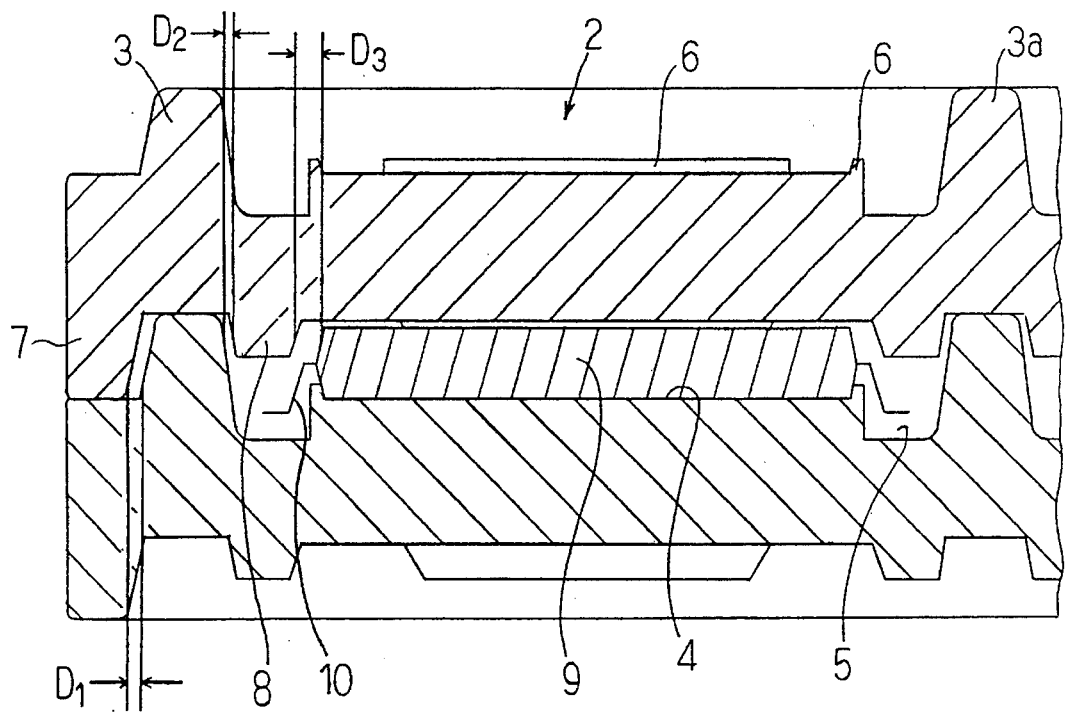
FIG. 5 is a longitudinal cross-sectional view illustrating the state of the tray of the embodiment in use.
Figure 6:
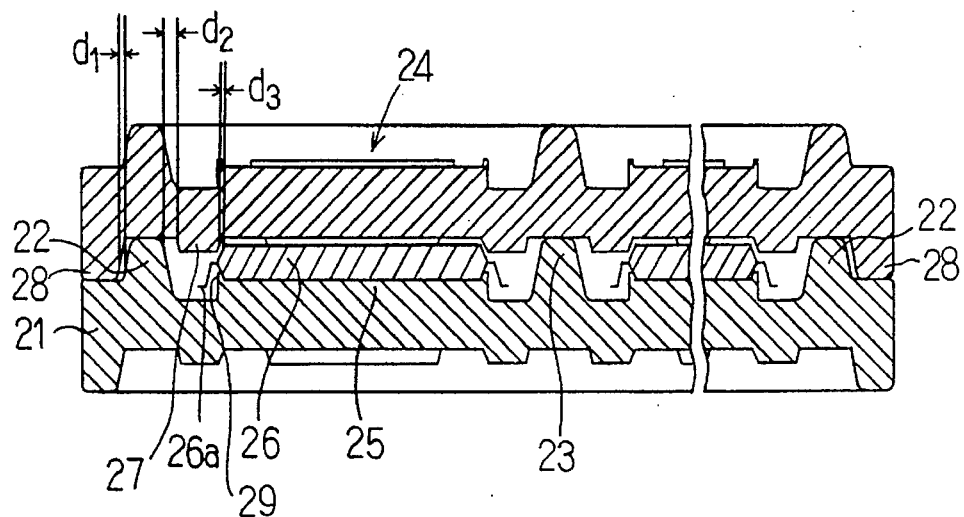
FIG. 6 is an enlarged longitudinal cross-sectional view of a conventional tray.

The relationships between the portions which comprise the upper surface and the undersurface of the tray 1 will be described with reference to FIG. 5, in which a semiconductor device 9 is mounted on the central portion of a base 4 in a pocket 2 in a tray 1 and covered with another tray 1 by putting said another tray 1 on the first tray 1.

According to the present invention in which at east two trays are piled up, spaces are provided between the inner wall of the edge frame 7 of the upper tray and the outer wall 9 of the outer peripheral frame 3 of the lower tray and between the outer wall of each downward extending rib 8 of the upper tray and the inner wall of the corresponding pocket 2 of the lower tray. The horizontal space $D_1$ between the inner wall of the edge frame 7 and the outer wall of the outer peripheral frame 3 is larger than the horizontal space $D_2$ between the outer wall of the downward extending rib 8 and the inner wall of the pocket 2. A horizontal space $D_3$ is provided between the inner wall of each of the downward extending ribs 8 and the side wall of the upper portion of the corresponding device 9 such that $D_3 > D_2$.

By doing so, the displacement between the upper and lower trays is limited by the horizontal space $D_2$ between the outer wall of the downward extending rib and the inner wall of the pocket. Thus, since the pressure due to a large shock applied to the trays when they are dropped is received by the inner wall of each pocket and the outer wall of each downward extending rib, the pressure due to the shock is distributed to the pockets and the pressure applied to each pocket becomes small. As the horizontal space $D_3$ between the inner wall of the downward extending rib 8 and the side wall of the upper portion of the device 9 is larger than the horizontal space $D_2$, the inner wall of each downward extending rib does not strongly press the side wall of the upper portion of the corresponding device, whereby leads 10 are prevented from being deformed and/or broken by fractures of the upward extending ribs due to deformation and/or breakage of the devices 9.

Between the upper surface off each device 9 and the undersurface of the upper tray a space is provided such that the device is not removed out of the portion surrounded by the upward extending rib 6 formed on the upper surface of the base so that the vertical loads are not applied to the devices when the trays are piled up.

Four downward extending ribs 8 are provided independently from each other so as to be fitted on the four edges of the corresponding pocket 2 of the lower trays in this embodiment. However, downward extending rib may have a continuous rectangular shape so as to be fitted on the whole periphery of the inner wall of each pocket, or downward ribs may be formed only on the portions of the underside of the tray which correspond to the four corners of each pocket so as to be fitted in the pocket at its four corners.

As the trays for semiconductor devices according to the present invention are constructed as described above, horizontal displacement between the upper and lower trays is limited by the space between the outer wall of each downward extending rib and the inner wall of the corresponding pocket when the trays are piled up.

In case the piled-up trays which house semiconductor devices receive a large shock when the trays are dropped during transportation, the shock is not exerted on local portions of the trays but is distributed to the inner walls of the pockets. Thus, a large shock is not applied to the devices.

The space between the inner wall of the downward extending rib 8 and the side walls of the upper portion of each device is larger than the space between the outer wall of the downward extending rib and the inner wall of the corresponding pocket. Thus, the arrangement prevents the downward extending ribs from pressing the devices.

When the trays housed in the pockets in the trays receive shock due to dropping of the trays or the like, distortion of the devices and breakage of upward extending ribs do not occur easily and deformation and/or breakage of the leads of the device due to fractures of the upward extending ribs can be prevented.

What is claimed is:

1. A tray for semiconductor devices on which another tray is mountable, said another tray having a same structure as said tray, said tray comprising:

an upper face, an undersurface and an outer periphery;

an outer peripheral frame extending upward from said upper face, said outer peripheral frame having an outer wall and defining a space;

longitudinal partition portions and crosswise partition portions formed in said space, for defining a plurality of substantially rectangular pockets, each pocket having a central portion and an inner wall;

an edge frame extending downward from said undersurface at said outer periphery, and said edge frame being formed so as to fit on said outer wall of said outer peripheral frame of said another tray which is disposed below said tray;

a base projectingly formed in said central portion of each of said pockets, for supporting an undersurface of a semiconductor device;

downward extending ribs formed on said undersurface of said tray, each of said downward extending ribs having an outer wall and an inner wall surrounding an upper portion of said semiconductor device housed in the corresponding pocket of said another tray which is disposed below said tray and fitted on said inner wall of said another tray disposed below said tray; and said outer peripheral frame and said edge frame defining therebetween a first horizontal space $D_1$, and said outer wall of said downward extending rib and said inner wall of said pocket defining therebetween a second horizontal space $D_2$, wherein $D_1 > D_2$.

2. The tray according to claim 1, wherein said side wall of said upper portion of each said semiconductor device housed in each of said pockets, and said inner wall of the corresponding downward extending rib, define therebetween a horizontal space $D_3$ which is larger than said space $D_2$.

3. The tray according to claim 2, wherein each of said downward extending ribs have a substantially rectangular shape, and are respectively arranged at positions so as to be fitted on the whole inner walls of respective substantially rectangular pockets of said another tray which is disposed below said tray.

4. The tray according to claim 2, wherein said downward extending ribs are discontinuous and have corners which are arranged at respective positions so as to be fitted in respective pockets at four respective corners of said respective pockets of said another tray which is disposed below said tray.

5. The tray according to claim 1, wherein said downward extending ribs are discontinuous and have corner portions which are arranged at respective positions so as to be fitted at four respective corners of each of said pockets of said another tray which is disposed below said tray.

6. The tray according to claim 1, wherein each of said downward extending ribs have a substantially rectangular shape, and are respectively arranged at positions so as to be fitted on the whole inner walls of respective substantially rectangular pockets of said another tray which is disposed below said tray.

7. The tray according to claim 1, wherein said downward extending ribs are discontinuous and have corner portions which are arranged at respective positions so as to be fitted in respective pockets at four respective corners of said respective pockets of said another tray which is disposed below said tray.

* * * * *